United States Patent
Yang et al.

(10) Patent No.: US 11,403,868 B2
(45) Date of Patent: Aug. 2, 2022

(54) DISPLAY SUBSTRATE HAVING TEXTURE INFORMATION IDENTIFICATION FUNCTION, METHOD FOR DRIVING THE SAME AND DISPLAY DEVICE

(71) Applicant: BOE TECHNOLOGY GROUP CO., LTD., Beijing (CN)

(72) Inventors: Shengji Yang, Beijing (CN); Xue Dong, Beijing (CN); Xiaochuan Chen, Beijing (CN); Hui Wang, Beijing (CN); Pengcheng Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 149 days.

(21) Appl. No.: 16/759,598

(22) PCT Filed: Mar. 27, 2019

(86) PCT No.: PCT/CN2019/079838
§ 371 (c)(1),
(2) Date: Apr. 27, 2020

(87) PCT Pub. No.: WO2020/191649
PCT Pub. Date: Oct. 1, 2020

(65) Prior Publication Data
US 2021/0042490 A1    Feb. 11, 2021

(51) Int. Cl.
*G06V 40/13* (2022.01)
*G10K 15/04* (2006.01)
(Continued)

(52) U.S. Cl.
CPC ......... *G06V 40/1306* (2022.01); *G10K 15/04* (2013.01); *H01L 27/3225* (2013.01);
(Continued)

(58) Field of Classification Search
CPC ...... G06K 9/0002; G10K 15/04; G06F 3/043; G06F 3/0412; H01L 27/3225; H01L 27/3246; H01L 27/3258
See application file for complete search history.

(56) References Cited

U.S. PATENT DOCUMENTS

2015/0021594 A1* 1/2015 Yamada ............ H01L 27/14616
257/43
2015/0125973 A1 5/2015 Choi
(Continued)

FOREIGN PATENT DOCUMENTS

CN    105046243 A    11/2015
CN    106530968 A *  3/2017 ......... G01S 15/8925
(Continued)

OTHER PUBLICATIONS

International Search Report of PCT/CN2019/079838 and English translation, dated Jan. 6, 2020, 14 pages.

*Primary Examiner* — Yuzhen Shen
(74) *Attorney, Agent, or Firm* — Muncy, Geissler, Olds & Lowe, P.C.

(57) ABSTRACT

A display substrate, a method for driving the same and a display device are provided. The display substrate includes a first base substrate, at least one vibrator and at least one identification unit. The at least one identification unit is on the first base substrate, the at least one identification unit is in a display area of the display substrate, and the at least one vibrator is on a side of the first base substrate facing away from the identification unit. The at least one vibrator is configured to drive the first base substrate to vibrate to emit an acoustic signal; and the at least one identification unit is configured to receive an ultrasonic signal reflected by an object to be detected, and convert the ultrasonic signal into a first electrical signal.

12 Claims, 5 Drawing Sheets

(51) Int. Cl.
*H01L 27/32* (2006.01)
*H01L 51/00* (2006.01)

(52) U.S. Cl.
CPC ...... *H01L 27/3246* (2013.01); *H01L 27/3258* (2013.01); *H01L 51/0097* (2013.01)

(56) References Cited

U.S. PATENT DOCUMENTS

| | | |
|---|---|---|
| 2017/0061190 A1 | 3/2017 | Chen et al. |
| 2017/0110504 A1* | 4/2017 | Panchawagh ......... H01L 41/311 |
| 2017/0186820 A1* | 6/2017 | Wang .................... H01L 27/323 |
| 2019/0065805 A1* | 2/2019 | Zhao ................... G01S 7/52085 |
| 2019/0095015 A1* | 3/2019 | Han ...................... G06F 3/0412 |
| 2019/0205603 A1* | 7/2019 | Lee .................... H01L 27/3225 |
| 2019/0251378 A1* | 8/2019 | Jung ......................... G01S 1/72 |
| 2020/0057475 A1* | 2/2020 | Ahn ...................... G06F 1/1626 |
| 2020/0100022 A1* | 3/2020 | Shin ...................... G06F 1/1637 |

FOREIGN PATENT DOCUMENTS

| | | | |
|---|---|---|---|
| CN | 106711320 A | 5/2017 | |
| CN | 106951130 A * | 7/2017 | ............. G06F 3/043 |
| CN | 107665068 A | 2/2018 | |
| CN | 108762546 A | 11/2018 | |
| CN | 109244108 A | 10/2019 | |

* cited by examiner

DISPLAY SUBSTRATE HAVING TEXTURE INFORMATION IDENTIFICATION FUNCTION, METHOD FOR DRIVING THE SAME AND DISPLAY DEVICE

CROSS-REFERENCE TO RELATED APPLICATION

This application is the U.S. national phase of PCT Application No. PCT/CN2019/079838 filed on Mar. 27, 2019, the disclosure of which is incorporated in its entirety by reference herein.

TECHNICAL FIELD

The present disclosure relates to the field of display technology, and in particular to a display substrate, a method for driving the display substrate, and a display device.

BACKGROUND

In recent years, with the rapid development of technologies, mobile products with biometric functions have gradually entered people's life and work. Fingerprint technology has attracted people's attention due to its unique identity characteristics, and its application in secure payment and other user experiences, etc. Press-type and slide-type fingerprint recognition technologies based on a silicon-based process have been integrated into mobile products. However, a fingerprint device is generally arranged in a non-display area, and a touch area needs to be set separately, resulting in complex manufacturing processes.

SUMMARY

In a first aspect, embodiments of the present disclosure provides a display substrate, which includes a first base substrate, at least one vibrator and at least one identification unit. The at least one identification unit is on the first base substrate, the at least one identification unit is in a display area of the display substrate, and the at least one vibrator is on a side of the first base substrate facing away from the identification unit. The at least one vibrator is configured to drive the first base substrate to vibrate to emit an acoustic signal. The at least one identification unit is configured to receive an ultrasonic signal reflected by an object to be detected, and convert the ultrasonic signal into a first electrical signal.

Optionally, the display substrate according to at least one embodiment of the present disclosure further includes a plurality of display units, where each of the at least one identification unit is between two adjacent display units.

Optionally, the display substrate according to at least one embodiment of the present disclosure further includes a plurality of display units, and each of the plurality of display units includes an anode, a light-emitting layer and a cathode. Each of the at least one identification unit includes a first electrode, a second electrode, and a piezoelectric material layer between the first electrode and the second electrode. The first electrode is on a same layer as the anode, or the first electrode is on a same layer as the cathode.

Optionally, the display substrate according to at least one embodiment of the present disclosure further includes a pixel defining layer, where the pixel defining layer is configured to define a plurality of pixel areas and at least one identification area, and each of the at least one identification area is between two adjacent pixel areas; and the plurality of display units is in the plurality of pixel areas, and the first electrode is in the at least one identification area.

Optionally, the display substrate according to at least one embodiment of the present disclosure further includes a thin film transistor array, a first buffer layer and a planarization layer that are located on the first base substrate in sequence, where the piezoelectric material layer is between the first buffer layer and the planarization layer.

Optionally, the thin film transistor array includes a driving transistor and a follower transistor, and the driving transistor includes an active layer, a gate insulating layer, a first gate electrode, a first interlayer dielectric layer and a source-drain electrode that are arranged in sequence. A gate electrode of the follower transistor is on a same layer as the first gate electrode of the driving transistor, and is electrically connected to the second electrode; and the second electrode is on a same layer as the source-drain electrode.

Optionally, the driving transistor further includes a second interlayer dielectric layer and a second gate electrode that are between the first gate electrode and the first interlayer dielectric layer; the second interlayer dielectric layer is between the first gate electrode and the second gate electrode; and an orthographic projection of the second gate electrode onto the first base substrate and an orthographic projection of the first gate electrode onto the first base substrate at least partially overlap.

Optionally, the display substrate according to at least one embodiment of the present disclosure further includes a second base substrate opposite to the first base substrate, where the second base substrate is on a side of the at least one vibrator away from the first base substrate.

Optionally, the display substrate according to at least one embodiment of the present disclosure further includes a plurality of acoustic wave isolation pillars between the first base substrate and the second base substrate and around the at least one vibrator.

Optionally, the first base substrate is a flexible substrate.

In a second aspect, embodiments of the present disclosure further provide a method for driving the above display substrate, which includes: in a detection stage, driving, by the at least one vibrator, the first base substrate to vibrate to emit an ultrasonic signal; and receiving, by the at least one identification unit, the ultrasonic signal reflected by the object to be detected, converting the ultrasonic signal into the first electrical signal, and obtaining corresponding texture information of the object to be detected based on the first electrical signal.

Optionally, the method for driving the display substrate according to at least one embodiment of the present disclosure further includes: in a display stage, driving, by the at least one vibrator, the first base substrate to vibrate to emit an audible acoustic signal.

In a third aspect, embodiments of the present disclosure further provide a display device, including the display substrate.

Optionally, the display device according to at least one embodiment of the present disclosure further includes a controller, where the controller is configured to receive the first electrical signal converted by the at least one identification unit, and obtain texture information of the object to be detected based on the first electrical signal.

DETAILED DESCRIPTION

Figure 1:
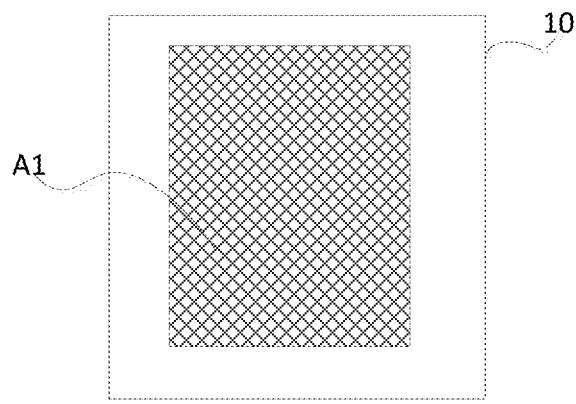
FIG. 1 is a schematic diagram of an active display area A1.

The technical solutions in embodiments of the present disclosure will be described clearly and completely in conjunction with drawings in the embodiments of the present disclosure. Apparently, the described embodiments are merely a part of the embodiments of the present disclosure, rather than all of the embodiments. All other embodiments obtained by a person of ordinary skill in the art based on the described embodiments of the present disclosure without paying creative efforts fall within the scope of the present disclosure.

The transistors used in all the embodiments of the present disclosure may be triodes, thin film transistors, field effect transistors, or other devices with the same characteristic. In embodiments of the present disclosure, in order to distinguish two electrodes of the transistor other than the control electrode, one of the electrodes is referred to as a first electrode, and the other electrode is referred to as a second electrode.

In an actual operation, in a case that a transistor is a triode, the control electrode may be a base electrode, the first electrode may be a collector electrode, and the second electrode may be an emitter electrode; or the control electrode may be a base electrode, the first electrode may be an emitter electrode, and the second electrode may be a collector electrode.

In an actual operation, in a case that a transistor is a thin film transistor or a field effect transistor, the control electrode may be a gate electrode, the first electrode may be a drain electrode, and the second electrode may be a source electrode; or, the control electrode may be a gate electrode, the first electrode may be a source electrode, and the second electrode may be a drain electrode.

The display substrate is provided according to at least one embodiment of the present disclosure, which includes a first base substrate, at least one vibrator and at least one identification unit. The at least one identification unit is arranged on the first base substrate, the at least one identification unit is arranged in a display area of the display substrate, and the at least one vibrator is on a side of the first base substrate facing away from the identification unit; the at least one vibrator is configured to drive the first base substrate to vibrate to emit an acoustic signal; and each of the at least one identification unit is configured to receive an ultrasonic signal reflected by an object to be detected, and convert the ultrasonic signal into a first electrical signal.

In the display substrate according to at least one embodiment of the present disclosure, the at least one vibrator is arranged on a side of the first base substrate, and the at least one vibrator drives the first base substrate to vibrate to emit an acoustic signal, so that fingerprint identification or palm print identification can be performed by the identification unit based on the first electrical signal obtained by converting the received ultrasonic signal. In the display substrate according to at least one embodiment of the present disclosure, the identification unit is disposed in the display area of the display substrate, and texture information identification of the object to be detected can be realized without separately setting a touch area in the non-display area, thereby simplifying the manufacturing process.

Optionally, the object to be detected may be a finger or a palm, and the texture information of the object to be detected may be fingerprint information or palm print information, but is not limited thereto.

In a specific implementation, the vibrator may be a vibration exciter, but is not limited thereto.

In a specific implementation, the display area of the display substrate may be an active area (AA); as shown in FIG. 1, a first base substrate is labelled by the reference numeral 10, and an active display area is labelled by the reference sign A1.

Optionally, the display substrate according to at least one embodiment of the present disclosure may further includes a plurality of display units, and each of the at least one identification unit is between two adjacent display units.

Figure 2:
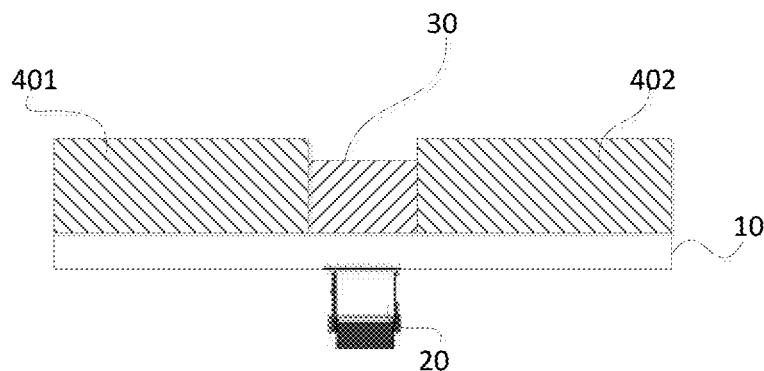
FIG. 2 is a structural diagram of a display substrate according to at least one embodiment of the present disclosure.

As shown in FIG. 2, the display substrate according to at least one embodiment of the present disclosure includes a first base substrate 10, a vibrator 20, an identification unit 30, a first display unit 401, and a second display unit 402.

The first display unit 401, the identification unit 30, and the second display unit 402 are disposed on the first base substrate 10. The first display unit 401, the identification unit 30, and the second display unit 402 are disposed in a display area of the display substrate.

The vibrator 20 is disposed on a side of the first base substrate 10 facing away from the identification unit 30, and is configured to drive the first base substrate 10 to vibrate during a detection stage to emit an ultrasonic signal.

The identification unit 30 is configured to receive the ultrasonic signal reflected by the object to be detected during the detection stage, convert the ultrasonic signal into a first electrical signal, and output the first electrical signal; and the first electrical signal is used to determine corresponding texture information of the object to be detected.

In FIG. 2, only two pixel units and one identification unit are shown by way of example. In actual operations, the number of vibrators may be at least one, and the number of the identification units may be multiple. In the display substrate according to at least one embodiment, the identification unit(s) are arranged in the display area according to actual needs and in consideration of a position of the vibrator.

When entering an ultrasonic fingerprint recognition detection mode, the vibrator sends out an ultrasonic signal, which is transmitted through the screen and reflected by a valley and ridge pattern of a finger, and the energies of ultrasonic waves reflected by the valley and ridge are different. The reflected energy wave passes through the piezoelectric material layer included in the identification unit, and an electrical signal is generated. Electrical signals converted from different reflected energies are different. The valley and ridge pattern of the finger is finally determined by comparing differences of the reflected energies.

In at least one embodiment of the present disclosure, the vibrator is further configured to drive the first base substrate to vibrate during a display stage to emit an audible sound signal.

Optionally, the first base substrate may be a flexible substrate, but is not limited thereto.

At least one embodiment of the present disclosure provides a design scheme of a display substrate with an ultrasonic fingerprint or palm print recognition function. The vibrator adopts a time-sharing vibration method to realize both the sounding and the ultrasonic fingerprint or palm print recognition on the screen during display.

Optionally, the flexible substrate may be a polyimide (PI) substrate, but is not limited thereto.

Optionally, the display substrate according to at least one embodiment of the present disclosure may further include a plurality of display units, and each of the plurality of display units includes an anode, a light-emitting layer and a cathode; each of the at least one identification unit includes a first electrode, a second electrode, and a piezoelectric material layer between the first electrode and the second electrode; and the first electrode is on a same layer as the anode, or the first electrode is on a same layer as the cathode.

In an actual operation, the first electrode may be inputted with a first voltage, but is not limited thereto; the piezoelectric material layer is configured to convert the ultrasonic signal into a second electrical signal and output the second electrical signal through the second electrode when sensing the ultrasonic signal reflected by the object to be detected.

Optionally, the first voltage may be a low voltage, a common electrode voltage, or a zero voltage, but is not limited thereto.

Optionally, the display substrate according to at least one embodiment of the present disclosure may further include a pixel defining layer, a plurality of pixel areas and at least one identification area are defined by the pixel defining layer, and each of the at least one identification area is between two adjacent pixel areas. The plurality of display units is in the pixel areas, and the first electrode is in the identification area.

In a specific implementation, the pixel defining layer defines a plurality of pixel areas and at least one identification area, each of the plurality of display units is arranged in a pixel area, and the first electrode is arranged in the at least one identification area.

Optionally, the display substrate according to at least one embodiment of the present disclosure may further include a thin film transistor array, a first buffer layer and a planarization layer that are located on the first base substrate in sequence, and the piezoelectric material layer is arranged between the first buffer layer and the planarization layer.

In an actual operation, the display substrate according to at least one embodiment of the present disclosure may include the TFT (Thin Film Transistor) array, a first buffer layer is provided on the TFT array, the piezoelectric material layer is formed on the first buffer layer, the planarization layer is formed on the piezoelectric material layer, and the display units, the first electrode, and the pixel defining layer are formed on the planarization layer.

Optionally, the first buffer layer may be made of $SiO_2$ (silicon dioxide), and the piezoelectric material layer may be a PVDF (polyvinylidene fluoride) layer, but is not limited thereto.

Optionally, the thin film transistor array may include a driving transistor and a follower transistor, and the driving transistor includes an active layer, a gate insulating layer, a first gate electrode, a first interlayer dielectric layer and a source-drain electrode that are arranged in sequence; a gate electrode of the follower transistor is arranged on a same layer as the first gate electrode of the driving transistor, and is electrically connected to the second electrode; and the second electrode is on the same layer as the source-drain electrode.

In an actual operation, the TFT array may include a driving transistor and a follower transistor, and the driving transistor may include an active layer, a gate insulating layer, a first gate electrode, a first interlayer dielectric layer and a source-drain electrode that are arranged in sequence, the TFT array is disposed on the first base substrate, and a second buffer layer may be provided between the TFT array and the first base substrate. In a specific implementation, the second electrode is electrically connected to the gate electrode of the follower transistor. In optional cases, the gate electrode of the follower transistor is provided on a same layer as the first gate electrode of the driving transistor, and the second electrode is provided in a same layer as the source-drain electrode, so as to simplify the manufacturing process.

Optionally, the driving transistor may further include a second interlayer dielectric layer and a second gate electrode that are between the first gate electrode and the first interlayer dielectric layer; the second interlayer dielectric layer is between the first gate electrode and the second gate electrode; and an orthographic projection of the second gate electrode onto the first base substrate and an orthographic projection of the first gate electrode onto the first base substrate at least partially overlap, to form a storage capacitor.

In the display substrate according to at least one embodiment of the present disclosure, the driving transistor may further include the second interlayer dielectric layer and the second gate electrode, and the first gate electrode, the second gate electrode and the second interlayer dielectric layer between the first gate electrode and the second gate electrode form a storage capacitor.

Optionally, the identification unit may further include an output control sub-unit. In a detection stage, the vibrator drives the first base substrate to vibrate to emit an ultrasonic signal. When the object to be detected contacts the display substrate, the ultrasonic signal is reflected by the object to be detected, the reflected energy wave passes through the piezoelectric material layer to generate a corresponding second electrical signal, and the output control sub-unit rectifies and converts the second electrical signal to obtain and output the first electrical signal to a corresponding column reading line.

Figure 3:
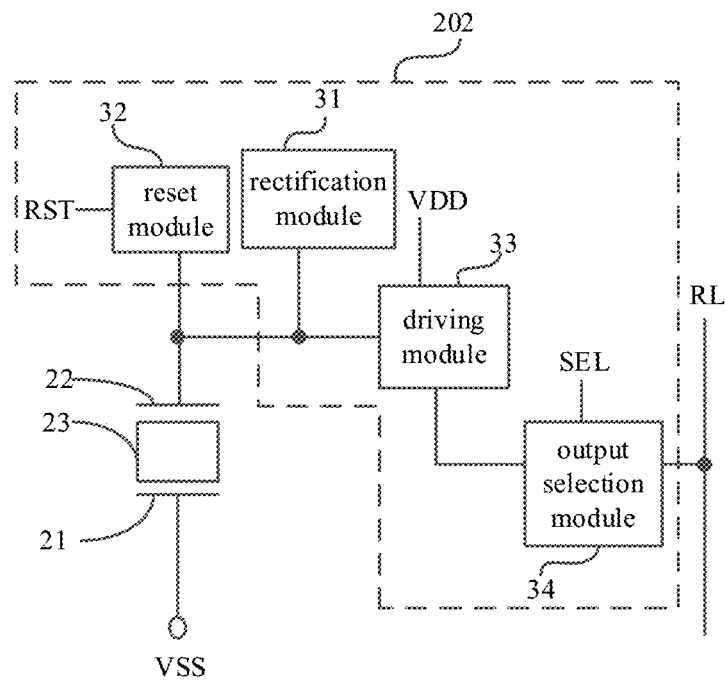
FIG. 3 a structural diagram of an identification unit in a display substrate according to at least one embodiment of the present disclosure.

In the identification unit of the display substrate according to at least one embodiment of the present disclosure, as shown in FIG. 3, the identification unit may include a first electrode 21, a second electrode 22, a piezoelectric material layer 23, and an output control sub-unit 202.

The output control sub-unit 202 may include a rectification module 31, a reset module 32, a driving module 33, and an output selection module 34.

The piezoelectric material layer 23 is disposed between the first electrode 21 and the second electrode 22. The piezoelectric material layer 23 is configured to convert the ultrasonic signal into a second electrical signal in a detection stage when sensing the ultrasonic signal reflected by the object to be detected, and output the second electrical signal through the second electrode 22.

The rectification module 31 is connected to the second electrode 22, and is configured to rectify the second electrical signal outputted from the second electrode 22 to obtain a third electrical signal.

The first electrode 21 is connected to a low voltage VSS.

A control terminal of the driving module 33 is connected to the second electrode 22, the reset module 32 is connected to the control terminal of the driving module 33, a first terminal of the driving module 33 is connected to a power voltage terminal, a second terminal of the driving module 33 is connected to a read line RL through the output selection module 34. The power voltage terminal is used to input a power voltage VDD.

The reset module 32 is configured to reset a voltage of the control terminal of the driving module 33 under the control of a reset control signal outputted from a reset control terminal RST.

The driving module 33 is configured to convert the third electrical signal into the first electrical signal in the detection stage.

The output selection module 34 is configured to output the first electrical signal to a read line RL under the control of a selection control signal outputted from a selection control terminal SEL.

In a case that an identification unit of the display substrate according to at least one embodiment of the present disclosure shown in FIG. 3 is in operation in a detection stage, the piezoelectric material layer 23 converts an ultrasonic signal into a corresponding second electrical signal when sensing the ultrasonic signal reflected by an object to be detected, and outputs a second electrical signal through the second electrode 22. The rectification module 31 rectifies the second electrical signal to obtain a third electrical signal, the driving module 33 converts the third electrical signal into a first electrical signal, and the output selection module 34 outputs the first electrical signal to RL under the control of the selection control signal outputted from SEL.

Figure 4:
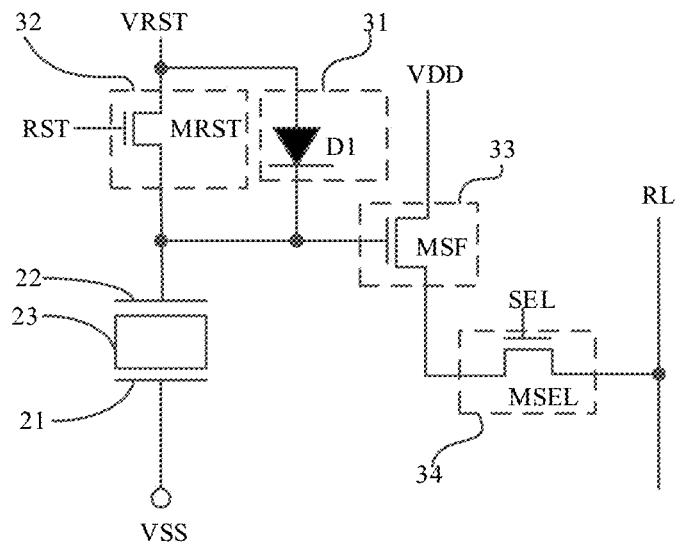
FIG. 4 is a circuit diagram of an identification unit in a display substrate according to at least one embodiment of the present disclosure.

Specifically, as shown in FIG. 4, in the identification unit of the display substrate according to at least one embodiment of the present disclosure, which is on the basis of the identification unit of the display substrate according to at least one embodiment of the present disclosure shown in FIG. 3, the rectification module 31 may include a rectifier diode D1, the reset module 32 may include a reset transistor MRST, the driving module 33 may include a follower transistor MSF, and the output selection module 34 may include an output selection transistor MSEL.

An anode of D1 is connected to a reset voltage VRST, and a cathode of D1 is connected to a gate electrode of MSF;

The gate electrode of MRST is connected to the reset control terminal RST, a first electrode of MRST is connected to the reset voltage VRST, and a second electrode of MRST is connected to the second electrode 22.

A first electrode of the MSF is connected to the power voltage terminal for inputting the power voltage VDD, and a second electrode of the MSF is connected to the first electrode of the MSEL.

A gate electrode of the MSEL is connected to the selection control terminal SEL, and the second electrode of the MSEL is connected to the read control line RL.

When the identification unit of the display substrate according to at least one embodiment of the present disclosure performs fingerprint recognition as shown in FIG. 4, the amount of ultrasound reflected by the valley of a finger is different from the amount of ultrasound reflected by the ridge of the finger. When sensing an ultrasonic signal reflected by the finger, the piezoelectric material layer 23 converts the ultrasonic signal into a corresponding electrical signal, a gate voltage of the MSF where the ultrasonic signal is reflected by the valley of the finger is different from a gate voltage of the MSF where the ultrasonic signal is reflected by the ridge of the finger. When the MSEL is turned on, different current values, different potentials, or different charges can be read by the read line RL; in the embodiment shown in FIG. 4, D1 is a rectifier, which can intercept and accumulate a square wave (or sine wave) reflected by a finger.

Figure 5:
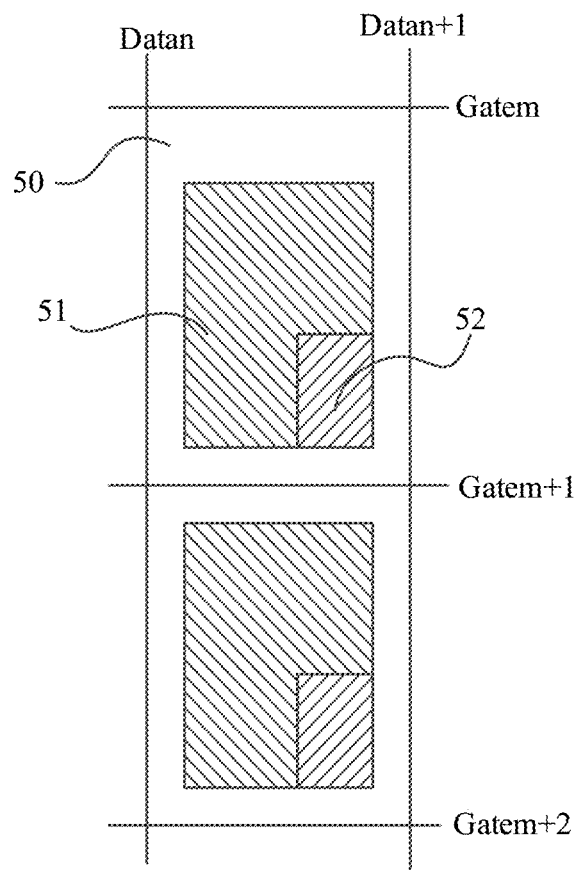
FIG. 5 is a schematic diagram of a display unit 51 and an identification unit 30 in a region 50 defined by gate lines and data lines.

In the display substrate according to at least one embodiment of the present disclosure, the identification unit(s) are arranged in a display area. Optionally, as shown in FIG. 5, a display unit 51 and an identification unit 30 may be provided in an area 50 defined by gate lines and data lines. In FIG. 5, the data line labeled Datan is the $n^{th}$ column of data line, the data line labeled Datan+1 is the $(n+1)^{th}$ column of data line, the data line labeled Gatem is the $m^{th}$ row of gate line, the data line labeled Gatem+1 is the $(m+1)^{th}$ row of gate line, the data line labeled Gatem+2 is the $(m+2)^{th}$ row of gate line, and both n and m are positive integers.

FIG. 5 is only a schematic diagram of the display unit 51 and the identification unit 30 provided in the area 50, and is not intended to limit the structure of the display substrate according to at least one embodiment of the present disclosure.

Figure 6:
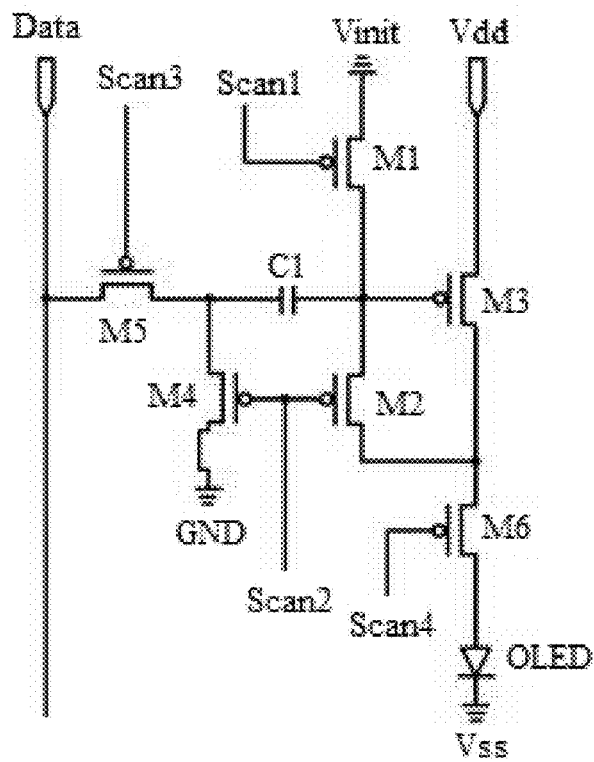
FIG. 6 is a circuit diagram of a pixel driving unit in a display substrate according to at least one embodiment of the present disclosure.

As shown in FIG. 6, a pixel driving unit in the display substrate is provided according to at least one embodiment of the present disclosure, which may include a first transistor M1, a second transistor M2, a driving transistor M3, a set transistor M4, a data writing transistor M5, a light-emitting control transistor M6 and a storage capacitor C1, the pixel driving unit is configured to drive an organic light-emitting diode OLED to emit light. This specific embodiment of the pixel driving unit can counteract the effect of the threshold voltage Vth of the driving transistor M3 on the display heterogeneity by compensation.

In FIG. 6, a data line is labeled Data, a grounded terminal is labeled GND, a first scan line is labeled Scan1, a second scan line is labeled Scan2, a third scan line is Scan3, a fourth scan line is labeled Scan4, the initial voltage is labeled Vinit, the power voltage is labeled Vdd, and the low voltage is labeled Vss.

Optionally, the displayed unit may include an organic light-emitting diode, but is not limited thereto.

Figure 7:
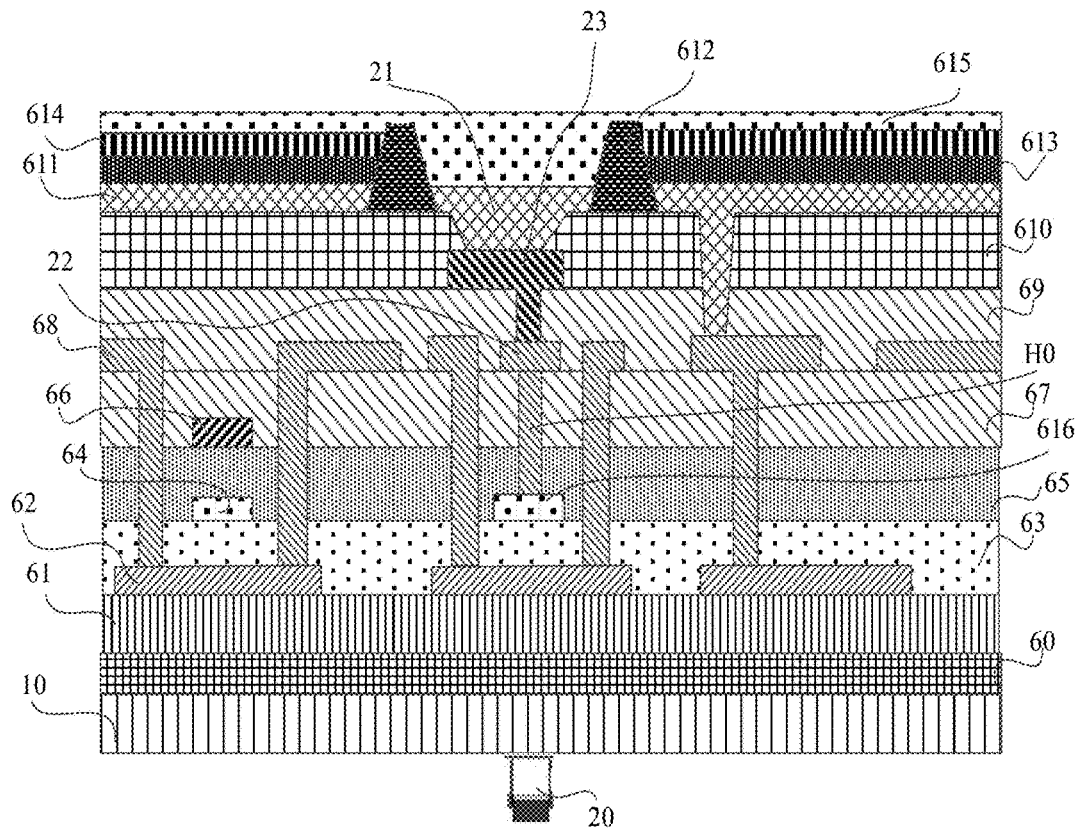
FIG. 7 is a structural diagram of a display substrate according to at least one embodiment of the present disclosure.

As shown in FIG. 7, the display substrate according to at least one embodiment of the present disclosure includes a first base substrate 10, at least one identification unit, a plurality of display units, a pixel defining layer 612, a thin film transistor array, a first buffer layer 69, a planarization layer 610, a second buffer layer 61, a first protection layer 60, and an encapsulation layer 615.

The first protection layer 60 is disposed on the first base substrate 10; the display substrate according to at least one embodiment of the present disclosure further includes a vibrator 20 arranged on a side of the first base substrate 10 facing away from the first protection layer 60; the second buffer layer 61 is disposed on the first protection layer 60.

Each of the plurality of display units includes an anode 611, a light-emitting layer 613 and a cathode 614.

Each identification unit includes a first electrode 21, a second electrode 22, and a piezoelectric material layer 23 between the first electrode 21 and the second electrode 22.

The thin film transistor array includes a driving transistor and a follower transistor. The driving transistor includes an active layer 62, a gate insulating layer 63, a first gate electrode 64, a second interlayer dielectric layer 65, a second gate electrode 66, a first interlayer dielectric layer 67 and a source-drain electrode 68 that are arranged in sequence.

The active layer 62 is disposed on the second buffer layer 61, the gate insulating layer 63 is disposed on the active layer 62, the first gate electrode 64 is disposed on the gate insulating layer 63, the second interlayer dielectric layer 65 is disposed on the first gate electrode 64, the second gate electrode 66 is disposed on the second interlayer dielectric layer 65, the first interlayer dielectric layer 67 is disposed on the second gate metal layer 66, the source-drain electrode 68 is disposed on the interlayer dielectric layer 67, and the second electrode 22 is disposed on the same layer as the source-drain electrode 68.

A gate electrode 616 of the follower transistor is disposed on a same layer as the first gate electrode 64.

An orthographic projection of the second gate electrode 66 onto the first base substrate 10 and an orthographic projection of the first gate electrode 64 onto the first base substrate 10 at least partially overlap. The first gate electrode 64, the second gate electrode 66, and the second interlayer dielectric layer 65 form a storage capacitor.

A first buffer layer 69 is provided above the second electrode 22 and the source-drain electrode 68, and the piezoelectric material layer 23 is provided on the first buffer layer 69. The piezoelectric material layer 23 is provided between the first electrode 21 and the second electrode 22.

The planarization layer 610 is disposed on the piezoelectric material layer 23; and the first electrode 21 is disposed on the planarization layer planarization layer 610.

The second electrode 22 and the gate electrode 616 of the follower transistor are electrically connected through a via hole HO that penetrates through the first interlayer dielectric layer 67 and the second interlayer dielectric layer 65.

The first electrode 21, the anode 611, and the pixel defining layer 612 are disposed on the planarization layer 610, and the anode 611 is disposed on the same layer as the first electrode 21; the pixel defining layer 612 defines a plurality of pixel areas and at least one identification area on the planarization layer 610; and the identification area is disposed between two adjacent pixel areas.

The anode 611, the light-emitting layer 613, and the cathode 614 are disposed in the pixel area, and the first electrode 21 is disposed in the identification area;

The light-emitting layer 613 is disposed on the anode 611, and the cathode 614 is disposed on the light-emitting layer 613.

The encapsulation layer 615 is disposed on the cathode layer 614, the pixel defining layer 612, and the first electrode 21.

In fabricating a display substrate, the source-drain electrode 68 and the second electrode 22 are formed in a single patterning process, and the anode 611 and the first electrode 21 are formed in a single patterning process, thereby simplifying the process;

In the display substrate according to at least one embodiment of the present disclosure as shown in FIG. 7, the shape of the via hole HO is only for example, and the shape of the via hole HO is not limited to the shape in FIG. 7.

In the display substrate according to at least one embodiment of the present disclosure as shown in FIG. 7, the first base substrate 10 is a flexible substrate, the piezoelectric material layer 23 may be a PVDF layer, and the vibrator 20 is a vibration exciter, which, however, are not limited thereto.

Figure 8:
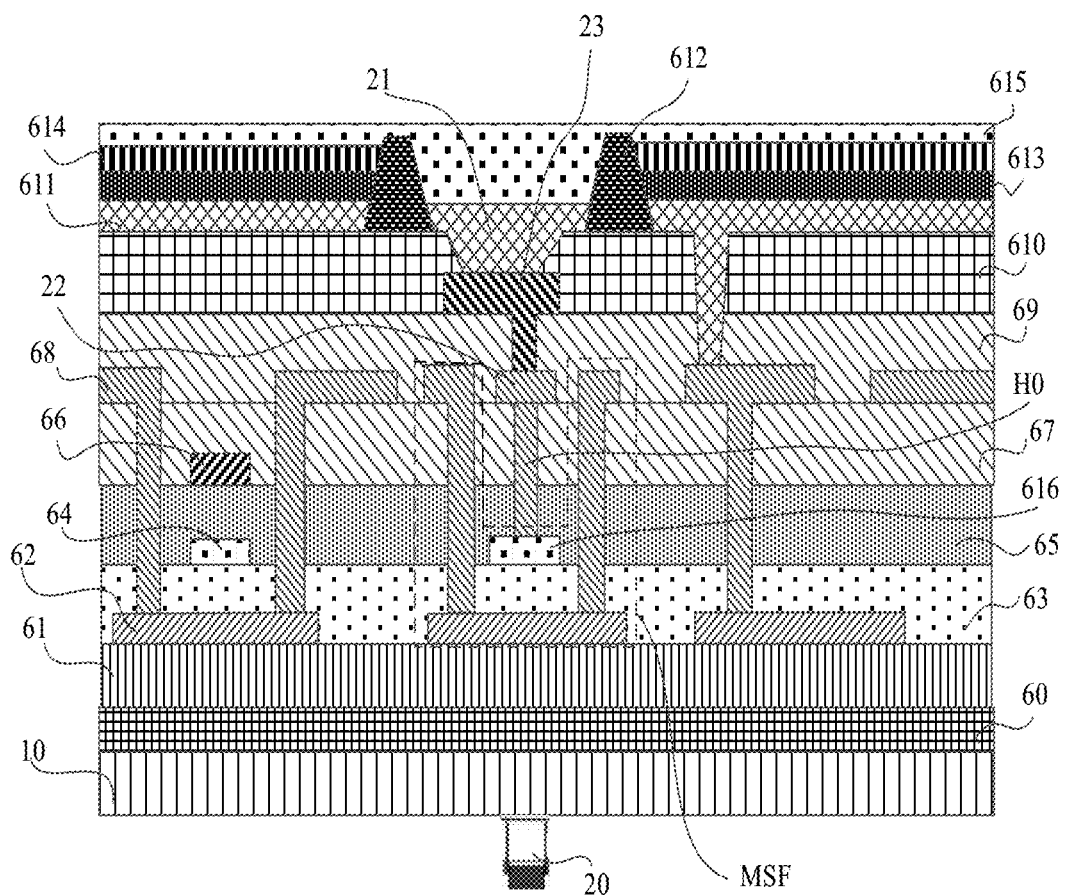
FIG. 8 is a structural diagram of a display substrate according to at least one embodiment of the present disclosure, where a follower transistor MSF is labeled.

The follower transistor MSF of the identification unit is shown in FIG. 8 on the basis of FIG. 7.

Figure 9:
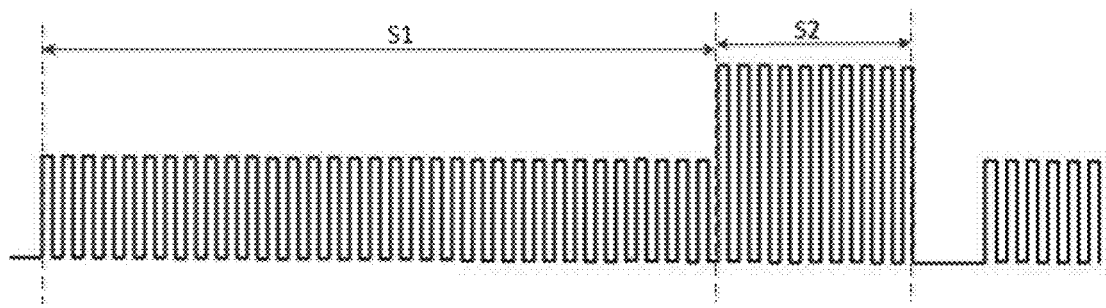
FIG. 9 is a waveform diagram of a signal emitted by a vibrator included in a display substrate according to at least one embodiment of the present disclosure.

The display substrate according to at least one embodiment of the present disclosure shown in FIG. 7 is in operation as shown in FIG. 9.

In a display stage S1, the vibrator 20 drives the first base substrate 10 to vibrate to emit an audible sound signal.

In a detection stage S2, the vibrator 20 drives the first base substrate 10 to vibrate to emit an ultrasonic signal, when sensing the ultrasonic signal reflected by the object to be detected, the piezoelectric material layer 23 converts the ultrasonic signal into a second electrical signal, and outputs the second electrical signal through the second electrode layer 22; the identification unit rectifies the second electrical signal to obtain a third electrical signal, converts the third electrical signal to obtain the first electrical signal, and controls the output of the first electrical signal; based on the first electrical signal, corresponding texture information of the object to be detected can be obtained.

In the display substrate according to at least one embodiment of the present disclosure, the identification unit is disposed in an active display area and adopts an ultrasonic vibration fingerprint identification method. Since ultrasound can detect information below the dermis of a finger, a more accurate fingerprint identification effect can be achieved. The display substrate according to at least one embodiment of the present disclosure is included in a sound-emitting flexible OLED (Organic Light-Emitting Diode) display device, and integrates a PVDF layer in the display substrate manufacturing process, and a vibrator exciter is arranged on the back of the base substrate 10, and the time-sharing vibration method is adopted to meet the requirements of sound emission and a ultrasonic vibration source, and to meet the audio-visual mode requirements of users.

The display substrate according to at least one embodiment of the present disclosure is provided with an identification unit in the display area. When the vibrator exciter emits an ultrasonic signal and a finger touches the outside of the display substrate, according to the difference in the amount of ultrasonic signals reflected by valleys and ridges of the finger, the signal is received by the identification unit, so as to determine the pattern of the finger and realize the high value-added integration of sounding of the flexible OLED substrate and the ultrasonic fingerprint recognition within a screen.

In the display substrate according to at least one embodiment of the present disclosure shown in FIG. 7, only one vibrator exciter is used as an example. However, in actual operations, the number of the vibrator exciters may also be multiple. The number of the vibrator exciters used in the display substrate according to at least one embodiment of the present disclosure is generally set according to the requirements of the stereo sound source.

When the display substrate according to at least one embodiment of the present disclosure shown in FIG. 7 is in operation, in the display stage, the vibrator exciter drives the first base substrate 10 to vibrate to emit an audible acoustic signal. As the flexible OLED substrate has the characteristics of being bendable, light and thin, a sounding function of a screen can be realized in combination with content displayed on the screen under the action of the vibrator exciter.

In a specific implementation, the frequency range of the audible sound signal is larger than or equal to 20 Hz (hertz), and smaller than or equal to 20 kHz (kilohertz).

The display substrate according to at least one embodiment of the present disclosure shown in FIG. 7 can realize in-screen fingerprint recognition by only adding the first buffer layer 69 and the piezoelectric material layer 23.

In a specific implementation, the display substrate according to at least one embodiment of the present disclosure may further include a second base substrate; the second base substrate is disposed opposite to the first base substrate, and the second base substrate is located on a side of the at least one vibrator far away from the first base substrate.

The at least one vibrator is disposed between the first base substrate and the second base substrate, and the second base substrate is a flexible substrate.

Optionally, the display substrate according to at least one embodiment of the present disclosure may further include a plurality of acoustic wave isolation pillars between the first base substrate and the second base substrate and around the at least one vibrator, so that sound can spread in a ring to ensure the sound enhancement effect.

In a specific implementation, the acoustic wave isolation pillar may be made of a negative photoresist, but is not limited thereto.

Figure 10:
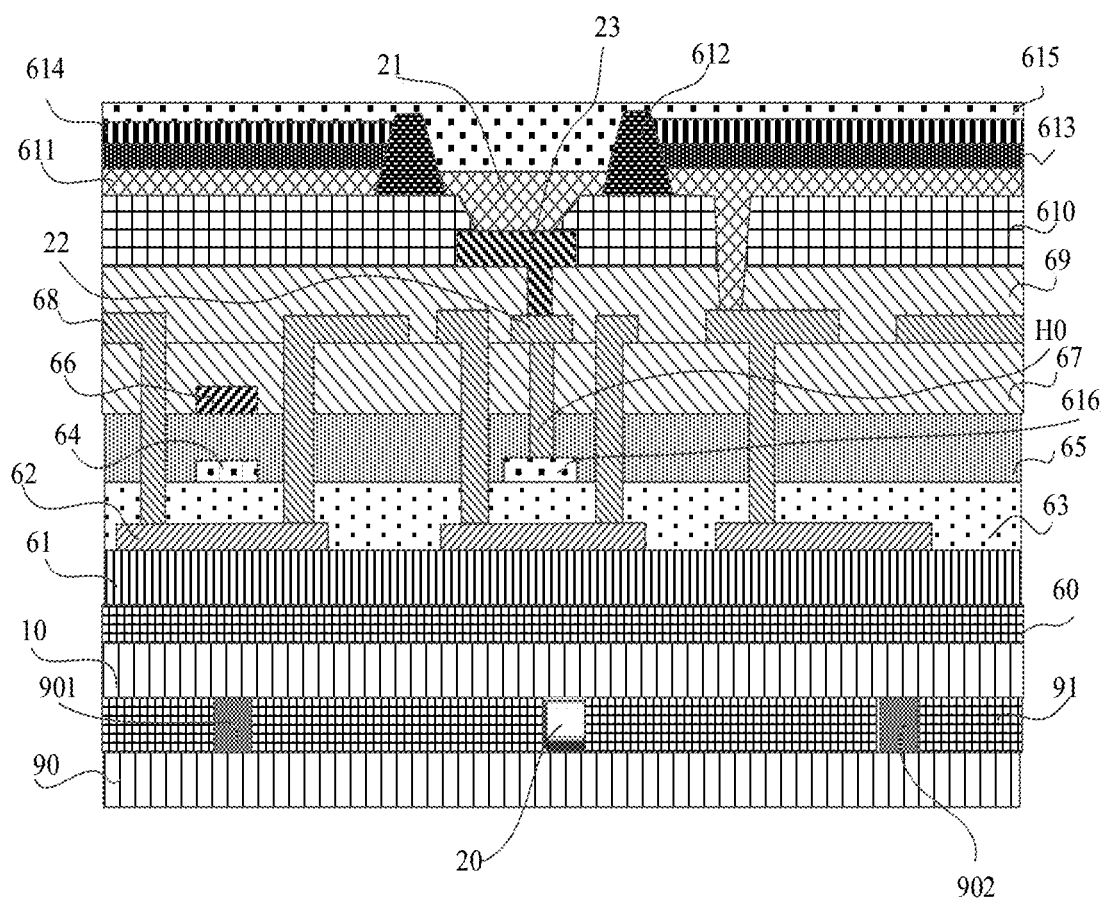
FIG. 10 is a structural diagram of a display substrate according to at least one embodiment of the present disclosure.

As shown in FIG. 10, on the basis of the display substrate according to at least one embodiment of the present disclosure shown in FIG. 7, the display substrate according to at least one embodiment of the present disclosure further includes a second base substrate 90 disposed opposite to the first base substrate 10.

A second protection layer 91 is disposed between the second base substrate 90 and the first base substrate 10.

The second base substrate 90 is located on a side of the vibrator 20 far away from the base substrate 10.

The vibrator 20 is disposed between the first base substrate 10 and the second base substrate 20, and a first acoustic wave isolation pillar 901 and a second acoustic wave isolation pillar are arranged around the vibrator 902. The second base substrate 90 is a PI substrate.

Only two acoustic wave isolation pillars are shown in FIG. 10. In actual operations, a plurality of acoustic wave isolation pillars may be provided around the vibrator 20.

A method for driving a display substrate is provided according to at least one embodiment of the present disclosure, which is configured to drive the above display substrate. The method for driving the display substrate according to at least one embodiment of the present disclosure includes: in a detection stage, driving, by the at least one vibrator, the first base substrate to vibrate to emit an ultrasonic signal; and receiving, by the at least one identification unit, an ultrasonic signal reflected by the object to be detected, converting the ultrasonic signal into a first electrical signal, and obtaining corresponding texture information of the object to be detected based on the first electrical signal.

In an optional case, the method for driving the display substrate may further include: in a display stage, driving, by the at least one vibrator, the first base substrate to vibrate to emit an audible acoustic signal.

A display device is provided according to at least one embodiment of the present disclosure, which includes the display substrate described above.

The display device provided in at least one embodiment of the present disclosure may be any product or component with a display function, such as a mobile phone, a tablet computer, a television, a display, a notebook computer, a digital photo frame, a navigator, and the like.

Optionally, the display device according to at least one embodiment of the present disclosure may further include a controller, the controller is configured to receive a first electrical signal converted by the at least one identification unit, and obtain texture information of the object to be detected based on the first electrical signal.

In a specific implementation, the controller is arranged in a peripheral area of the display substrate (the peripheral area is arranged in a periphery of the active display area), or the controller may be arranged in a driving integrated circuit.

Based on the display substrate, the method for driving the same and the display device according to the at least one embodiment of the present disclosure, the identification unit(s) are set in the display area, and the texture information identification of the object to be detected can be achieved without separately setting a touch area in a non-display area, to simplify manufacturing processes.

The above descriptions merely describe optional implementations of the present disclosure. It should be noted that numerous modifications and improvements can be made by a person of ordinary skill in the art without departing from the principle of the present disclosure, and these modifications and improvements shall fall within the protection scope of the present disclosure.

What is claimed is:

1. A display substrate, comprising:
   a first base substrate, at least one vibrator and at least one identification circuit,
   wherein the at least one identification circuit is on the first base substrate, the at least one identification circuit is in a display area of the display substrate, and the at least one vibrator is on a side of the first base substrate facing away from the identification circuit,
   wherein the at least one vibrator is configured to drive the first base substrate to vibrate to emit an acoustic signal,
   wherein the at least one identification circuit is configured to receive an ultrasonic signal reflected by an object to be detected, and convert the ultrasonic signal into a first electrical signal,
   wherein the display substrate further comprises a plurality of display units,
   wherein each of the plurality of display units comprises an anode, a light-emitting layer and a cathode,
   wherein each of the at least one identification circuit comprises a first electrode, a second electrode, and a piezoelectric material layer between the first electrode and the second electrode,
   wherein the first electrode is on a same layer as the anode, or the first electrode is on a same layer as the cathode,
   wherein the display substrate further comprises a thin film transistor array, a first buffer layer and a planarization layer that are located on the first base substrate in sequence, and the piezoelectric material layer is electrically connected to the second electrode through a via hole penetrating through the first buffer layer,
   wherein the display substrate further comprises a pixel driving circuit configured to drive a display unit to emit light, wherein the thin film transistor array comprises a driving transistor of the pixel driving circuit and a follower transistor of the identification circuit, and the driving transistor comprises an active layer, a gate insulating layer, a first gate electrode, a first interlayer dielectric layer and a source-drain electrode that are arranged in sequence, wherein a gate electrode of the follower transistor is on a same layer as the first gate electrode of the driving transistor, and is electrically connected to the second electrode, and wherein the second electrode is on a same layer as the source-drain electrode.

2. The display substrate according to claim 1, wherein each of the at least one identification circuit is between two adjacent display units.

3. The display substrate according to claim 1, further comprising a pixel defining layer, wherein the pixel defining layer is configured to define a plurality of pixel areas and at least one identification area, and each of the at least one identification area is between two adjacent pixel areas; and the plurality of display units is in the plurality of pixel areas, and the first electrode is in the at least one identification area.

4. The display substrate according to claim 3, wherein the piezoelectric material layer is between the first buffer layer and the planarization layer.

5. The display substrate according to claim 1, wherein the driving transistor further comprises a second interlayer dielectric layer and a second gate electrode that are between the first gate electrode and the first interlayer dielectric layer;

the second interlayer dielectric layer is between the first gate electrode and the second gate electrode; and an orthographic projection of the second gate electrode onto the first base substrate and an orthographic projection of the first gate electrode onto the first base substrate at least partially overlap.

6. The display substrate according to claim 1, further comprising a second base substrate opposite to the first base substrate, wherein the second base substrate is on a side of the at least one vibrator away from the first base substrate.

7. The display substrate according to claim 6, further comprising a plurality of acoustic wave isolation pillars between the first base substrate and the second base substrate and around the at least one vibrator.

8. The display substrate according to claim 1, wherein the first base substrate is a flexible substrate.

9. A method for driving the display substrate according to claim 1, comprising:

in a detection stage, driving, by the at least one vibrator, the first base substrate to vibrate to emit an ultrasonic signal; and receiving, by the at least one identification circuit, the ultrasonic signal reflected by the object to be detected, converting the ultrasonic signal into the first electrical signal, and obtaining corresponding texture information of the object to be detected based on the first electrical signal.

10. The method for driving the display substrate according to claim 9, further comprising:

in a display stage, driving, by the at least one vibrator, the first base substrate to vibrate to emit an audible acoustic signal.

11. A display device, comprising the display substrate according to claim 1.

12. The display device according to claim 11, further comprising a controller, wherein the controller is configured to receive the first electrical signal converted by the at least one identification circuit, and obtain texture information of the object to be detected based on the first electrical signal.

* * * * *